(12) United States Patent
Chakravarty et al.

(10) Patent No.: US 9,932,224 B2
(45) Date of Patent: Apr. 3, 2018

(54) SEMICONDUCTOR DEVICES WITH CAVITIES AND METHODS FOR FABRICATING SEMICONDUCTOR DEVICES WITH CAVITIES

(71) Applicant: Globalfoundries Singapore Pte. Ltd., Singapore (SG)

(72) Inventors: Siddharth Chakravarty, Philadelphia, PA (US); Rakesh Kumar, Singapore (SG); Pradeep Yelehanka, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/973,319

(22) Filed: Dec. 17, 2015

(65) Prior Publication Data

US 2017/0174507 A1 Jun. 22, 2017

(51) Int. Cl.
*B81B 7/00* (2006.01)
*B81C 1/00* (2006.01)

(52) U.S. Cl.
CPC ........ *B81C 1/00293* (2013.01); *B81B 7/0074* (2013.01); *B81B 2203/0315* (2013.01); *B81C 2201/0105* (2013.01); *B81C 2201/0132* (2013.01); *B81C 2201/0133* (2013.01); *B81C 2203/0136* (2013.01)

(58) Field of Classification Search
CPC ................. B81B 7/0077; B81B 7/008; B81B 2203/0315; B81B 7/0074; B81C 2201/013; B81C 1/00119; B81C 2201/0105; B81C 1/0015; B81C 1/00912; H01L 2221/1063; H01L 21/306; H01L 21/042

See application file for complete search history.

(56) References Cited

U.S. PATENT DOCUMENTS

| | | | |
|---|---|---|---|
| 6,753,200 B2 | 6/2004 | Craighead et al. | |
| 2004/0245586 A1* | 12/2004 | Partridge | B81C 1/00301 257/414 |
| 2006/0278879 A1 | 12/2006 | Busta | |
| 2009/0206422 A1* | 8/2009 | Illing | B81C 1/00158 257/419 |
| 2009/0267166 A1* | 10/2009 | Verheijden | B81C 1/00476 257/415 |
| 2010/0307786 A1* | 12/2010 | Kohl | B81C 1/00333 174/50.51 |
| 2013/0129118 A1* | 5/2013 | Mao | H04R 19/005 381/174 |

* cited by examiner

*Primary Examiner* — Galina Yushina
(74) *Attorney, Agent, or Firm* — Lorenz & Kopf, LLP

(57) ABSTRACT

Semiconductor devices with enclosed cavities and methods for fabricating semiconductor devices with enclosed cavities are provided. In an embodiment, a method for fabricating a semiconductor device with a cavity includes forming a sacrificial structure in and/or over a substrate. The method includes depositing a permeable layer over the sacrificial structure and the substrate. Further, the method includes etching the sacrificial structure through the permeable layer to form the cavity bounded by the substrate and the permeable layer.

20 Claims, 4 Drawing Sheets

SEMICONDUCTOR DEVICES WITH CAVITIES AND METHODS FOR FABRICATING SEMICONDUCTOR DEVICES WITH CAVITIES

TECHNICAL FIELD

The technical field generally relates to semiconductor devices, and more particularly relates to semiconductor devices with cavities and to methods for fabricating devices with cavities, including cavities housing device structures.

BACKGROUND

Enclosed cavities may be found in a number of devices formed by semiconductor processing. For example, devices such as micro-fluidic devices, nano-fluidic devices, or other types of devices are formed with enclosed cavities, such as capillaries and chambers. Also, micro-electromechanical systems (MEMS) devices may by formed with enclosed cavities with or without internal device structures such as cantilever beams and/or bridges.

Conventional semiconductor processing forms enclosed cavities by complex methods. For example, a substrate may be etched to form trenches and a cap wafer may be bonded to the substrate to enclose the trenches as enclosed cavities. For example, the substrate and cap wafer may be bonded through direct bonding or through eutectic bonding in which an adhesion layer and a eutectic material are used between the substrate and cap wafer to assist in bonding. Such bonding methods typically require an anneal process. Further, such bonding methods require the substrate and cap wafer to have smooth, flat surfaces for bonding. Also, such methods may require grinding of the cap wafer to a desired thickness. Such methods are not used to form enclosed cavities over complementary metal-oxide-semiconductor (CMOS) devices. Other methods also include complex processing to form enclosed cavities.

Accordingly, it is desirable to provide simpler and more efficient CMOS compatible integration schemes and enabling methodology. Also, it is desirable to provide improved methods for fabricating semiconductor devices with enclosed cavities, with or without internal structures. It is desirable to provide methods for etching enclosed cavities through a permeable layer. Further, it is desirable to provide methods for fabricating semiconductor devices in which cavity-encapsulating layers are formed together before the enclosed cavity is formed therebetween. It is also desirable to provide methods for fabricating semiconductor devices in which enclosed cavities are formed in a substrate without a planar top surface. Also, it is desirable to provide improved semiconductor devices with enclosed cavities. Furthermore, other desirable features and characteristics will become apparent from the subsequent detailed description and the appended claims, taken in conjunction with the accompanying drawings and this background.

BRIEF SUMMARY

Semiconductor devices with enclosed cavities and methods for fabricating semiconductor devices with enclosed cavities are provided. In an embodiment, a method for fabricating a semiconductor device with an enclosed cavity includes forming a sacrificial structure in and/or over a substrate. The method includes depositing a permeable layer over the sacrificial structure and the substrate. Further, the method includes etching the sacrificial structure through the permeable layer to form the enclosed cavity bounded by the substrate and the permeable layer.

In another exemplary embodiment, a method for forming a hidden cavity and device structure therein is provided. The method includes forming a lower portion of a sacrificial structure on a semiconductor substrate. Further, the method includes forming the device structure over the semiconductor substrate and the lower portion of the sacrificial structure. Also, the method includes forming an upper portion of the sacrificial structure over the device structure and lower portion of the sacrificial structure. The method encapsulates the sacrificial structure with a permeable layer. Further, the method etches the sacrificial structure through the permeable layer to form the hidden cavity and device structure encapsulated by the substrate and the permeable layer.

In yet another exemplary embodiment, a semiconductor device is provided and includes a substrate including a topside. The semiconductor device also includes a permeable layer located over the substrate and including an underside. The underside of the permeable layer and the topside of the substrate bound a cavity. The semiconductor device further includes a capping layer located on the permeable layer.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein:

FIGS. 7-13 illustrate exemplary processing for forming a semiconductor device with an enclosed cavity in accordance with another embodiment;

DETAILED DESCRIPTION

The following detailed description is merely exemplary in nature and is not intended to limit the devices with cavities or methods for fabricating devices with cavities. Furthermore, there is no intention to be bound by any expressed or implied theory presented in the preceding technical field, background or brief summary, or in the following detailed description.

For the sake of brevity, conventional techniques related to integrated circuit device fabrication may not be described in detail herein. Moreover, the various tasks and processes described herein may be incorporated into a more comprehensive procedure or process having additional steps or functionality not described in detail herein. In particular, various steps in the fabrication of integrated circuits are well-known and so, in the interest of brevity, many conventional steps will only be mentioned briefly herein or will be omitted entirely without providing the well-known process details.

As used herein, it will be understood that when an element or layer is referred to as being "over" another element or layer, it may be directly on the other element or layer, or intervening elements or layers may be present. When an element or layer is referred to as being "on" another element or layer, it is directly on and in contact with the other element or layer. Further, spatially relative terms, such as "above", "lower", "upper", "side", "topside", "underside" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass either an orientation of above or an orientation of below. The device may be otherwise oriented (rotated 90 degrees or at other orientations) and the spatially relative descriptors used herein may likewise be interpreted accordingly.

In accordance with the various embodiments herein, devices such as micro-electromechanical systems (MEMS) devices, micro-fluidic devices, nano-fluidic devices, or other types of devices are formed with enclosed cavities. Such devices may be implemented in many applications, including healthcare applications, such as in micro-pumps, inhalers, in vitro diagnostics, lab-on-a-chip, chemical sensors, or other applications. The Figures illustrate exemplary embodiments for fabricating devices with enclosed cavities. FIGS. 1-6 and FIGS. 7-13 illustrate two embodiments of exemplary processing for forming devices with enclosed cavities. FIGS. 14-19 illustrate an embodiment of exemplary processing for forming a device with an enclosed cavity and internal structure therein. FIGS. 20-25 illustrate another embodiment of exemplary processing for forming a device with an enclosed cavity and internal structure therein.

Figure 1:
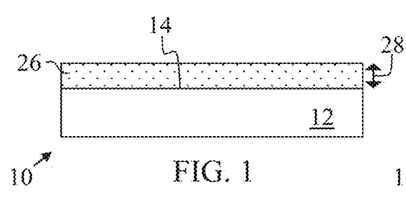
FIGS. 1-6 illustrate exemplary processing for forming a semiconductor device with an enclosed cavity in accordance with an embodiment.

As illustrated in FIG. 1, in accordance with an exemplary embodiment herein, the fabrication of a semiconductor device 10 includes providing a substrate 12 in and/or on which such semiconductor devices are fabricated. The substrate 12 may be a semiconductor substrate or may be positioned over a semiconductor substrate. Other devices, such as CMOS devices may be fabricated in and/or over the semiconductor substrate before, during or after the processing described herein. As used herein, the term "semiconductor substrate" encompasses semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, and the like. In an exemplary embodiment, the semiconductor material is a silicon substrate, such as crystalline silicon. The silicon substrate may be a bulk silicon wafer or may be a thin layer of silicon (on an insulating layer commonly known as silicon-on-insulator or SOI) that, in turn, is supported by a carrier wafer. In certain embodiments, the substrate 12 may be a metal layer. In other embodiments, the substrate 12 may be glass. Further, the substrate may be provided with protective layers such as amorphous or polycrystalline silicon for protection against etchants. As referred to herein, a material that includes a recited element/compound includes the recited element/compound in an amount of at least 10 weight percent based on the total weight of the material unless otherwise indicated.

As shown, the semiconductor substrate 12 has an upper surface 14. Upper surface 14 may be substantially planar or may have "topography", i.e., be non-planar. In FIG. 1, a sacrificial material is deposited over the upper surface 14 of the semiconductor substrate to form sacrificial layer 26. An intervening layer or layers may be first deposited over the semiconductor substrate 12 and located between the semiconductor substrate 12 and sacrificial layer 26 if desired. In such embodiments, the upper surface 14 will be formed by the uppermost intervening layer.

In some embodiments, the height 28 of the sacrificial layer 26 is determinative of the interior vertical dimension of the later-formed cavity. A sacrificial layer 26 having a height 28 of from about 2 nm to about 30 μm, for example, from about 5 nm to about 15 μm, or from about 5 nm to about 10 μm, may be selected for some products, though any desired thickness suitable for the vertical dimension of a cavity may be provided. For example, the height 28 may be from about 2 nm to about 2000 nm, such as from about 2 nm to about 100 nm, from about 1 nm to about 50 nm, from about 1 nm to about 25 nm, or from about 1 nm to about 15 nm. An exemplary sacrificial material is silicon oxide, though other materials such as silicate glass can be used. In an exemplary embodiment, the sacrificial material is deposited by chemical vapor deposition (CVD), though any process providing sufficient precision in control of layer height uniformity may be used.

Figure 2:
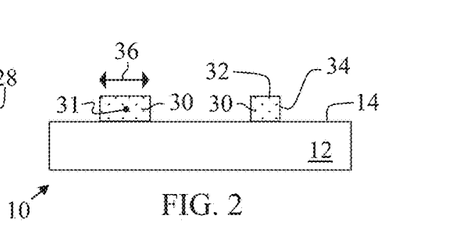

In FIG. 2, the sacrificial layer 26 is etched to form sacrificial structures 30. Sacrificial structures 30 extend in a longitudinal direction 31 parallel to the upper surface 14 of the semiconductor substrate 12 and perpendicular to the plane of the drawing sheet. A suitable lithographic process may be used to etch the sacrificial layer 26. For example, a resist material and hard mask may be formed over the sacrificial layer 26 and patterned to expose selected regions of the sacrificial layer 26 during an etch process. An exemplary etch process is an anisotropic wet etch or dry etch. Processes that do not use a resist material, such as laser machining, may also be used to define the sacrificial structures 30.

As shown, each sacrificial structure 30 has a substantially horizontal upper surface 32 and substantially vertical side surfaces 34. The sacrificial structures 30 are formed with the height 28 from upper surface 32 to the surface 14 of the semiconductor substrate 12 and with a width 36 between opposite side surfaces 34. In an exemplary embodiment, width 36 is from about 2 nm to about 1000 μm, such as from about 2 nm to about 2000 nm, such as from about 2 nm to about 100 nm, from about 1 nm to about 50 nm, from about 1 nm to about 25 nm, or from about 1 nm to about 15 nm. While the two illustrated sacrificial structures 30 have the same height 28 and different widths 36, they may be formed with same widths through conventional lithography processes and/or with different heights by selectively recessing a portion of the sacrificial layer 26 before or after etching. While the sacrificial structure 30 is illustrated as a simple line structure, the sacrificial structure 30 may be complex, including horizontal and vertical portions, voids, and/or non-planar components.

Figure 3:
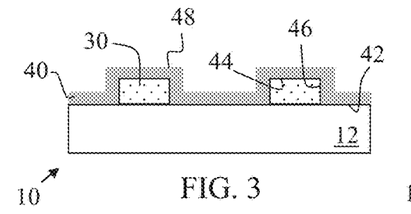

The method may continue in FIG. 3 with the formation of a permeable layer 40 over the structure of the partially fabricated device 10 in FIG. 2. For example, a permeable material may be deposited over the upper surface 14 of the semiconductor substrate 12 and over the upper surface 32 and side surfaces 34 of the sacrificial structures 30 to form the permeable layer 40. In an exemplary embodiment, the permeable material is deposited by sputtering or plasma enhanced CVD (PECVD). Exemplary permeable materials include thin titanium/titanium nitride (Ti/TiN) layers, aluminum copper/molybdenum (Al Cu/Mo) layers, silicon carbide (SiC), amorphous silicon (A-Si), and silicon nitride (SiN) such as silicon rich SiN. The permeable material may be selected for use with a desired later-used etchant. Specifically, the permeable material should allow the etchant of the sacrificial material to pass through the permeable layer 40.

The permeable layer 40 includes an underside 42 that includes a ceiling portion 44 and side portions 46 on the respective top and side surfaces of each sacrificial structure 30. Further, the permeable layer 40 includes a topside 48. The permeable layer 40 may be formed with a height or thickness of from about 10 nm to about 5 µm. The permeable layer 40 may be selected to be permeable to a gaseous etchant and impermeable to liquid. Alternatively, the permeable layer 40 may be selected to be permeable to a liquid etchant.

Figure 4:
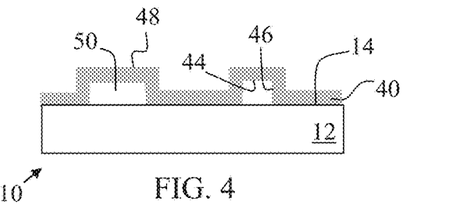

In FIG. 4, an etching process is performed to remove the sacrificial structures 30 from the partially fabricated device 10. Specifically, an etchant is contacted with the topside 48 of the permeable layer 40 and passes or permeates through the permeable layer 40 to contact the upper surface 32 and side surfaces 34 of the sacrificial structures 30 and the surface 14 of the semiconductor substrate 12. The etchant is selected so that etching of the surface 14 of the semiconductor substrate 12 does not occur. Further, the etchant is selected so that the sacrificial structures 30 are selectively etched while the permeable layer 40 is not etched and retains structural integrity. The etchant may be gaseous or liquid. An exemplary etchant is hydrofluoric (HF) vapor. Such an etchant is appropriate for removing sacrificial structures 30 made of silicon oxide and for use with a permeable layer 40 made of HF permeable material such as amorphous silicon, silicon nitride, silicon carbide, titanium, or titanium/titanium nitride (Ti/TiN). In other embodiments, the substrate 12 may be metal, the sacrificial structures 30 may be made of polycrystalline silicon or amorphous silicon, the etchant may be xenon difluoride ($XeF_2$) vapor, and the permeable layer 40 may be permeable to $XeF_2$.

As shown, all of the material forming the sacrificial structures 30 is removed via the etch process. The product or products of the reaction between the etchant and the material forming the sacrificial structures 30 also passes or permeates through the permeable layer 40. As a result, enclosed cavities 50 are defined between the permeable layer 40 and the substrate 12. Specifically, each cavity 50 is bounded by the surface 14 of the substrate 12, the ceiling portion 44 of the permeable layer 40, and the side portions 46 of the permeable layer 40. As a result, each cavity 50 is completely encapsulated by the permeable layer 40 and the substrate 12. Further, each cavity 50 is formed with height 28 and width 36. As permeable layer 40 is not etched, the ceiling surface 44 is planar and continuous and each side portion 46 is planar and continuous.

Figure 5:
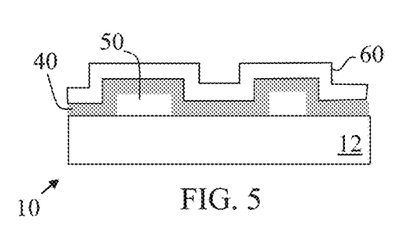

In FIG. 5, a capping layer 60 is formed over the permeable layer 40. For example, a capping material, such as a metal, silicon carbide, amorphous silicon, silicon rich silicon nitride, silicon oxide, or another suitable material, is conformally deposited over the permeable layer 40 to form the capping layer 60. For example, the capping material may be deposited by sputtering, PECVD, or another suitable conformal process. As shown, the capping layer 60 is separated from each cavity 50 by the permeable layer 40. The permeable layer 40 is impermeable to the capping material. As a result, the process for depositing the capping material is not limited by considerations of how to keep the capping material from entering the enclosed cavities 50. Rather, the capping material is physically blocked from entering the enclosed cavities 50 by the permeable layer 40.

Figure 6:
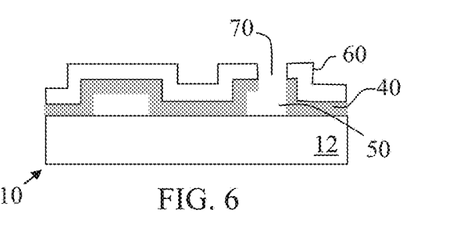

FIG. 6 illustrates an optional process for selectively opening a cavity 50. While for certain uses enclosed cavities 50 are sealed for use without any openings, other uses require that enclosed cavities 50 be opened for gaseous or liquid fluidic flow into and out of the enclosed cavities 50. FIG. 6 illustrates forming a representative opening 70 to a cavity 50. As shown, the capping layer 60 and permeable layer 40 may be selectively etched to form the opening 70. A conventional lithography process may be used, in which a mask is formed and patterned to expose the region of the device 10 to be etched. An exemplary etch process is anisotropic.

As a result of the processes illustrated in FIGS. 1-6, enclosed cavities 50 are formed under a permeable layer 40 and over a substrate 12. The enclosed cavities 50 are bounded only by the permeable layer 40 and substrate 12. Further, the permeable layer 40 is not etched during processing to form the enclosed cavities 50 (though the permeable layer 40 may be later etched to form openings to the enclosed cavities 50). Therefore, the permeable layer 40 is not patched or otherwise filled in to completely encapsulate the enclosed cavities 50. Rather, the enclosed cavities 50 are completely encapsulated or closed by the substrate 12 and the permeable layer 40 immediately upon formation during the etching process.

Figure 7:
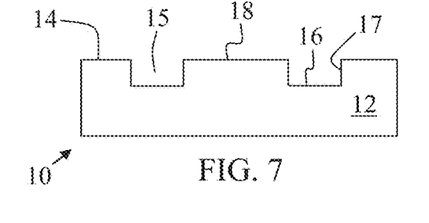

FIGS. 7-13 illustrate an alternate process for forming enclosed cavities 50. The process of FIGS. 7-13 may utilize the same materials, structures, dimensions, and deposition and etching processes as those described in relation to FIGS. 1-6. In FIG. 7, the substrate 12 is provided with planar upper surface 14 and is selectively etched to form trenches 15. Each trench is bounded by a bottom surface 16 and side surfaces 17 formed by the substrate 12. The trenches 15 may be formed according to conventional lithography processes including masking and etching. After formation of the trenches 15, the substrate 12 may be considered to have an upper surface 18 formed by the unetched surface 14, the trench side surfaces 17 and the trench bottom surfaces 16. The surfaces 14, 16 and 17 may be formed from or coated with protective layers such as amorphous or polycrystalline silicon for protection against etchants.

Figure 8:
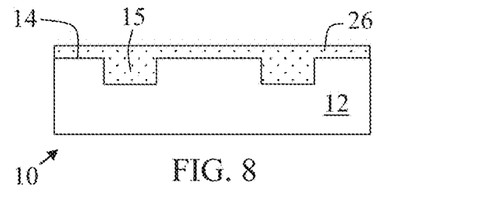

In FIG. 8, the sacrificial layer 26 is formed over the substrate 12. For example, a sacrificial material is conformally deposited to fill the trenches 15 and may form an overburden portion over the surface 14 of the substrate 12.

Figure 9:
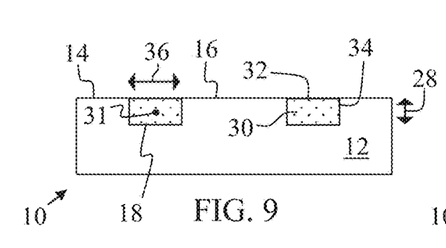

In FIG. 9, the sacrificial layer 26 is planarized, such as by chemical mechanical planarization (CMP), to the surface 14 of the substrate 12. As result, sacrificial structures 30 are formed in the trenches 15. As shown, the sacrificial structures 30 extend in direction 31 parallel the surface 14 of the substrate 12. Each sacrificial structure 30 is formed with upper surface 32 and side surfaces 34. Side surfaces 34 are formed in contact with the trench side surfaces of the substrate 12. Further, each sacrificial structure 30 is formed with width 36. Also, each sacrificial structure 30 is formed with height 28 equal to the trench depth. As such, height 28 is not dependent on the thickness of the sacrificial layer 26 as deposited in FIG. 8.

Figure 10:
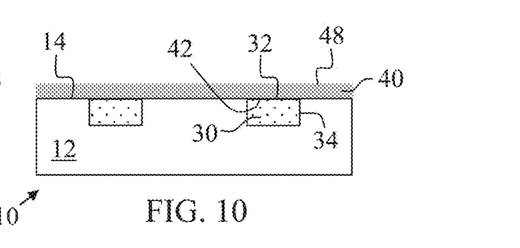

In FIG. 10, permeable layer 40 is formed over the substrate 12 and sacrificial structures 30. Unlike the embodiment of FIGS. 1-6, in FIG. 10 the permeable layer 40 is formed with a substantially planar underside 42 and substantially planar topside 48. Also, unlike the embodiment of FIGS. 1-6, in FIG. 10 the permeable layer 40 contacts only the upper surface 32 and not the side surfaces 34 of the sacrificial structures 30.

Figure 11:
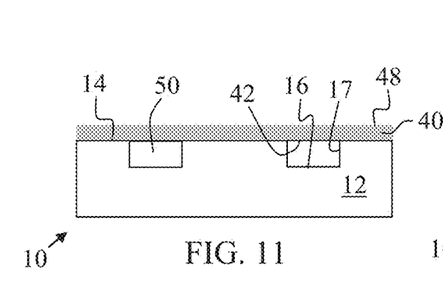

In FIG. 11, the sacrificial structures 30 are etched to form enclosed cavities 50. For example, a selected etchant is contacted with the topside 48 of the permeable layer 40 and passes or permeates through the permeable layer 40 into contact with the upper surface 32 of the sacrificial structures 30 and with the surface 14 of the substrate 12. In the embodiment of FIG. 11, the etchant does not directly attack the side surfaces 34 of the sacrificial structures 30 as they are in contact with the substrate 12 rather than exposed as in the embodiment of FIGS. 1-6.

Upon removal of the sacrificial structures 30 resulting from the etching process, the enclosed cavities 50 are bounded only by, and are completely encapsulated by, the permeable layer 40 and the substrate 12. Specifically, each cavity is bounded by the trench bottom surface 16 and the trench side surfaces 17 of the substrate 12 and by the underside 42 of the permeable layer 40.

The method may proceed in FIG. 12 with the formation of capping layer 60 over the permeable layer 40. In FIG. 12, the capping layer 60 includes a continuous and substantially planar lower surface 62 and a continuous and substantially planar upper surface 64.

Figure 13:
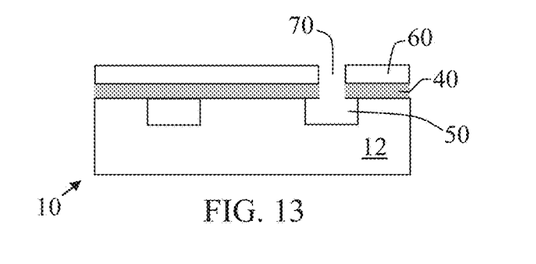

FIG. 13 illustrates the optional step of opening a selected cavity 50. Specifically, an opening 70 is etched through the capping layer 60 and the permeable layer 40 and is formed in fluid communication with the selected cavity 50.

As a result of the processes illustrated in FIGS. 7-13, enclosed cavities 50 are formed under a permeable layer 40 and over a substrate 12. The enclosed cavities 50 are bounded only by the permeable layer 40 and substrate 12. Further, the permeable layer 40 is not etched during processing to form the enclosed cavities 50 (though the permeable layer 40 may be later etched to form openings to the enclosed cavities 50). Therefore, the permeable layer 40 is not patched or otherwise filled in to completely encapsulate the enclosed cavities 50. Rather, the enclosed cavities 50 are completely encapsulated or closed by the substrate 12 and the permeable layer 40 immediately upon formation during the etching process.

FIGS. 14-19 illustrate an exemplary process for forming enclosed cavities with internal device structures therein. The process of FIGS. 14-19 may utilize the same materials, structures, dimensions, and deposition and etching processes as those described in relation to FIGS. 1-13.

Figure 14:
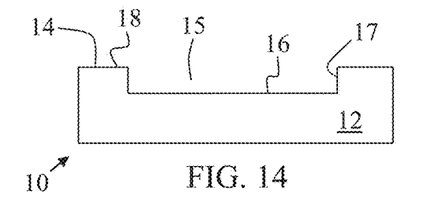
FIGS. 14-19 illustrate exemplary processing for forming a semiconductor device with an enclosed cavity and internal device structure in accordance with another embodiment.

In FIG. 14, the substrate 12 is provided with planar upper surface 14 and is selectively etched to form a trench 15. The trench 15 is bounded by a bottom surface 16 and side surfaces 17 formed by the substrate 12. The trenches 15 may be formed according to conventional lithography processes including masking and etching. After formation of the trench 15, the substrate 12 may be considered to have an upper surface 18 formed by the un-etched surface 14, the trench side surfaces 17 and the trench bottom surfaces 16. Each of the surfaces 14, 16 and 17 may be formed from or coated with protective layers such as amorphous or polycrystalline silicon for protection against etchants.

Figure 15:
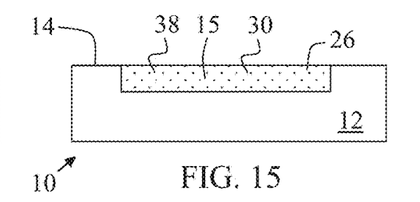

In FIG. 15, the sacrificial layer 26 is formed over the substrate 12. For example, a sacrificial material is conformally deposited to fill the trench 15 and may form an overburden portion over the surface 14 of the substrate 12. The sacrificial layer 26 is planarized, such as by chemical mechanical planarization (CMP), to the surface 14 of the substrate 12. As result, a lower portion 38 of a sacrificial structure 30 is formed in the trench 15.

The lower portion 38 of the sacrificial structure 30 is formed with an upper surface and side surfaces as described above in relation to FIGS. 7-13. The side surfaces are formed in contact with the trench side surfaces 17 of the substrate 12. Further, the lower portion 38 of the sacrificial structure 30 is formed with a width and with a height equal to the trench depth. FIGS. 14-15 form the lower portion 38 of the sacrificial structure 30 in a manner similar to that of FIGS. 7-13; however, the lower portion of the sacrificial structure 30 may be formed according to the processing of FIGS. 1-6.

Figure 16:
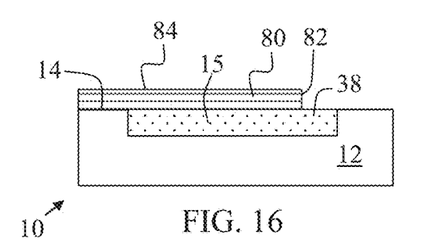

The process may continue as shown in FIG. 16 with the formation of a device structure 80 over the substrate 12 and lower portion 38 of the sacrificial structure 30. For example, device structure 80 may be formed by the successive deposition and patterning of layers such as structure layers and protective layers. Structure layers may be formed from polycrystalline silicon, amorphous silicon, or metals like aluminum, copper, gold, or mixtures thereof, or other suitable materials. In an exemplary embodiment, the device structure 80 includes a polycrystalline silicon body with outer metal layer portions. Depending on the selection of the later-used etchant, a protective layer may be formed on the outer surfaces, i.e., bottom, top, side and end surfaces, of the device structure 80 to prevent etching of the device structure 80.

In an exemplary process, a lower protective layer, such as polycrystalline silicon, amorphous silicon or metal, may be deposited over and in direct contact with the substrate 12 and lower portion 38 of the sacrificial material. A device structure material or materials may then be deposited over the lower protective layer. An upper protective layer, such as polycrystalline silicon, amorphous silicon or metal, may be deposited over the device structure materials. In order to protect sidewall and endwall surfaces 82 of the device structure materials, the device structure materials and lower protective layer may be patterned and etched before the upper protective layer is deposited. Thus, the upper protective layer will coat the sidewall and endwall surfaces 82 of the device structure materials and encapsulate the device structure materials with protective layers. As shown, the device structure 80 extends over but does not enclose the lower portion 38 of the sacrificial structure as there must be access to the lower portion 38 of the sacrificial structure for later removal.

Figure 17:
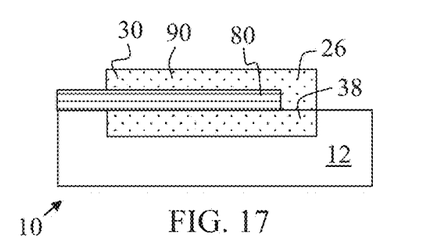

In FIG. 17, additional sacrificial layer 26 is formed over the substrate 12. For example, a sacrificial material is conformally deposited over and in direct contact with the device structure 80, the lower portion 38 of sacrificial structure 30 and the substrate 12. The sacrificial layer 26 may be planarized, such as by chemical mechanical planarization (CMP), and is patterned and etched to form the upper portion 90 of the sacrificial structure 30. The process for forming the upper structure 90 of the sacrificial structure 30 is similar to that described in FIGS. 1-6; however, it is contemplated that the upper structure 90 of the sacrificial structure 30 could be formed using the process of FIGS. 7-13 and an additional substrate layer with a trench exposing underlying layers and structures.

While FIGS. 16-17 illustrate the formation of a simple device structure 80 having a planar top surface 84 and end surface 82, it is contemplated that a device structure 80 of any shape or configuration possible with deposition and lithography processing may be formed. For example, additional layers of device structure 80 and sacrificial structure 30 could be selectively formed by repeating the processes of FIGS. 16-17.

Figure 18:
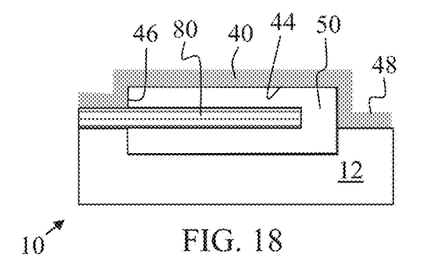

In FIG. 18, permeable layer 40 is formed as described above. As shown, the permeable layer 40 is formed over the substrate 12, device structure 80, and sacrificial structure 30. The permeable layer 40 of FIG. 18 includes a non-planar topside 48 though other embodiments may form a planar topside 48.

Then, an etching process is performed to remove the sacrificial structure 30 from the partially fabricated device 10. Specifically, an etchant is contacted with the topside 48 of the permeable layer 40 and passes or permeates through the permeable layer 40 to contact the upper surface and side surfaces of the upper portion 90 of the sacrificial structure 30. Further, after etching through the upper portion 90 of the sacrificial structure 30, the etchant contacts and etches the lower portion 38 of the sacrificial structure 30. As shown, while the device structure 80 and substrate 12 remain un-etched, all of the material forming the upper portion 90 and lower portion 38 of the sacrificial structure 30 is removed via the etch process. The product or products of the reaction between the etchant and the material forming the sacrificial structures 30 may pass or permeate through the permeable layer 40. As a result, enclosed cavity 50 is defined between the permeable layer 40 and the substrate 12 and device structure 80. The cavity 50 is completely encapsulated by the permeable layer 40, substrate 12, and device structure 80. As permeable layer 40 is not etched, the ceiling surface 44 of permeable layer 40 is planar and continuous and each side portion 46 of permeable layer 40 is planar and continuous.

Figure 19:
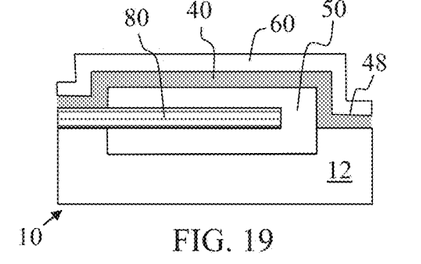

In FIG. 19, a capping layer 60 is formed over the permeable layer 40. For example, a capping material is deposited on the upper surface 48 of the permeable layer 40 as described above. As shown, the capping layer 60 is separated from the cavity 50 by the permeable layer 40. The permeable layer 40 is impermeable to the capping material. As a result, the process for depositing the capping material is not limited by considerations of how to keep the capping material from entering the enclosed cavity 50. Rather, the capping material is physically blocked from entering the enclosed cavity 50 by the permeable layer 40.

As a result of the processes illustrated in FIGS. 14-19, an enclosed cavity 50 is formed under a permeable layer 40 and over a substrate 12. Further, the enclosed cavity 50 houses a device structure 80, such as a cantilever beam or bridge for use in a MEMS device. The enclosed cavity 50 is bounded only by the permeable layer 40, substrate 12, and device structure 80. Further, the permeable layer 40 is not etched during processing to form the enclosed cavity 50 and device structure 80 (though the permeable layer 40 may be later etched to form openings to the enclosed cavity 50). Therefore, the permeable layer 40 is not patched or otherwise filled in to completely encapsulate the enclosed cavity 50.

FIGS. 20-25 illustrate another exemplary process for forming enclosed cavities with internal device structures therein. The process of FIGS. 20-25 may utilize the same materials, structures, dimensions, and deposition and etching processes as those described in relation to FIGS. 1-19.

Figure 20:
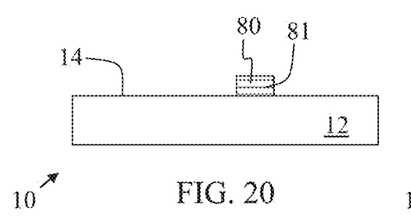
FIGS. 20-25 illustrate exemplary processing for forming a semiconductor device with an enclosed cavity and internal device structure in accordance with another embodiment.

In FIG. 20, the substrate 12 is provided with planar upper surface 14. A lower portion 81 of a device structure 80 is formed over the substrate 12. For example, the lower portion 81 of device structure 80 may be formed by the successive deposition and patterning of layers such as structure layers and protective layers, as described above.

Figure 21:
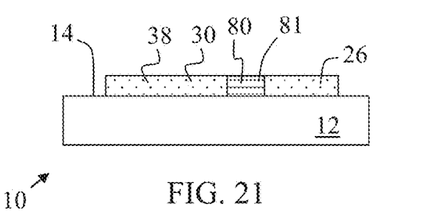

In FIG. 21, a sacrificial layer 26 is formed over the substrate 12. For example, a sacrificial material is conformally deposited on the substrate 12 adjacent the lower portion 81 of device structure 80. The sacrificial material forms an overburden portion over the lower portion 81 of device structure 80. The sacrificial layer 26 is planarized, such as by chemical mechanical planarization (CMP), to the lower portion 81 of device structure 80 and is patterned and etched to form a lower portion 38 of a sacrificial structure 30 adjacent the lower portion 81 of device structure 80.

Figure 22:
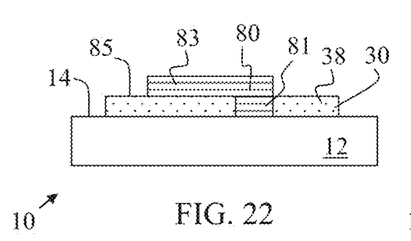

In FIG. 22, an upper portion 83 of device structure 80 is formed over the substrate 12. For example, the upper portion 83 of device structure 80 may be formed by the successive deposition and patterning of layers such as structure layers and protective layers, as described above. The upper portion 83 of device structure 80 is formed over and in contact with the lower portion 81 of the device structure 80 and the lower portion 38 of sacrificial structure 30. The upper portion 83 of device structure 80 may be etched from the surface 14 and from the ends 85 of the lower portion 38 of sacrificial structure 30.

Figure 23:
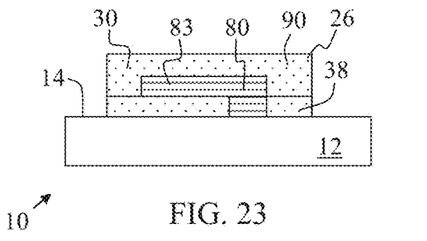

In FIG. 23, additional sacrificial layer 26 is formed over the substrate 12. For example, a sacrificial material is conformally deposited over and in direct contact with the upper portion 83 of device structure 80, the lower portion 38 of sacrificial structure 30 and the substrate 12. The sacrificial layer 26 may be planarized, such as by chemical mechanical planarization (CMP), and is patterned and etched to form the upper portion 90 of the sacrificial structure 30.

Figure 24:
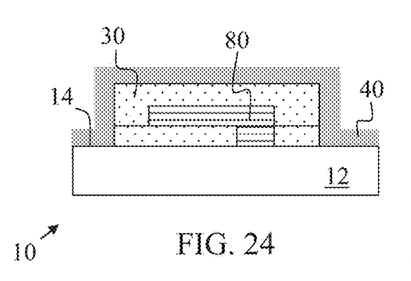

In FIG. 24, permeable layer 40 is formed as described above. As shown, the permeable layer 40 is formed over the substrate 12, device structure 80, and sacrificial structure 30, and in contact with the substrate 12 and sacrificial structure 30.

Figure 25:
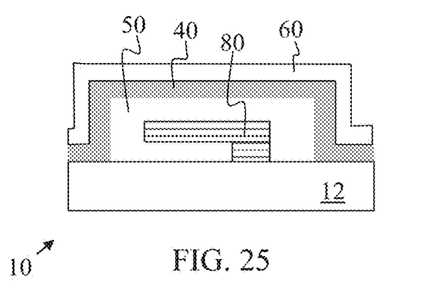

The method may continue in FIG. 25 with an etching process that is performed to remove the sacrificial structure 30 from the partially fabricated device 10. Specifically, an etchant is contacted with the topside of the permeable layer 40 and passes or permeates through the permeable layer 40 to contact the upper portion and the lower portion of the sacrificial structure 30. As shown, while the device structure 80 and substrate 12 remain un-etched, all of the material forming the sacrificial structure 30 is removed via the etch process. The product or products of the reaction between the etchant and the material forming the sacrificial structures 30 may pass or permeate through the permeable layer 40. As a result, enclosed cavity 50 is defined between the permeable layer 40 and the substrate 12 and device structure 80. The cavity 50 is completely encapsulated by the permeable layer 40 and substrate 12. As permeable layer 40 is not etched, the ceiling surface of permeable layer 40 is planar and continuous and each side portion of permeable layer 40 is planar and continuous.

In FIG. 25, a capping layer 60 is formed over the permeable layer 40. For example, a capping material is deposited on the upper surface of the permeable layer 40 as described above. As shown, the capping layer 60 is separated from the cavity 50 by the permeable layer 40. The permeable layer 40 is impermeable to the capping material.

As a result, the process for depositing the capping material is not limited by considerations of how to keep the capping material from entering the enclosed cavity 50. Rather, the capping material is physically blocked from entering the enclosed cavity 50 by the permeable layer 40.

As a result of the processes illustrated in FIGS. 20-25, an enclosed cavity 50 is formed under a permeable layer 40 and over a substrate 12. Further, the enclosed cavity 50 houses a device structure 80, such as a cantilever beam or bridge for use in a MEMS device. The enclosed cavity 50 is bounded only by the permeable layer 40 and substrate 12. Further, the permeable layer 40 is not etched during processing to form the enclosed cavity 50 and device structure 80 (though the permeable layer 40 may be later etched to form openings to the enclosed cavity 50). Therefore, the permeable layer 40 is not patched or otherwise filled in to completely encapsulate the enclosed cavity 50.

In an exemplary embodiment, the methods described herein reduce processing complexity as compared to conventional techniques. Also, the methods described herein avoid complex processes, such as wafer bonding, that are limited to planar substrates and wafers, and may be integrated with CMOS device fabrication. Further, the methods described herein can produce enclosed cavities having different widths or heights through simple lithography techniques. Also, an embodiment described herein provides for the formation of a capping layer with continuous planar surfaces and without patches. Embodiments are also provided in which a device structure, such as a cantilever beam or bridge, is formed within an enclosed cavity.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. A method for fabricating a semiconductor device with a cavity, the method comprising:
providing a substrate terminating at an uppermost surface;
forming a sacrificial structure in and/or over the substrate;
forming a device structure overlying a lower portion of the sacrificial structure, overlying the uppermost surface of the substrate, and underlying an upper portion of the sacrificial structure;
depositing a permeable layer over the sacrificial structure, the device structure and the substrate, wherein the permeable material has a bottom surface in contact with the sacrificial structure and with the substrate; and
etching the sacrificial structure through the permeable layer to form the cavity, wherein the cavity has an outer surface completely bounded by the substrate, the device structure, and the permeable layer.

2. The method of claim 1 wherein etching the sacrificial structure through the permeable layer to form the cavity results in encapsulating the cavity with the substrate, the device structure, and the permeable layer upon formation.

3. The method of claim 2 further comprising:
depositing a capping layer over the permeable layer; and
etching an opening through the capping layer and through the permeable layer to open the cavity at a selected location.

4. The method of claim 1 wherein:
the permeable material has a top surface; and
etching the sacrificial structure through the permeable layer to form the cavity comprises contacting the top surface of the permeable material with an etchant and permeating the etchant through the permeable material into contact with the sacrificial structure and into contact with the substrate.

5. The method of claim 1 wherein the permeable material is unetched before etching the sacrificial structure through the permeable layer to form the cavity.

6. The method of claim 1 wherein etching the sacrificial structure through the permeable layer to form the cavity comprises permeating an etchant through the permeable layer and into contact with the sacrificial structure.

7. The method of claim 1 further comprising depositing a capping layer over the permeable layer.

8. The method of claim 1 wherein at least a portion of the device structure is housed within the cavity after etching the sacrificial structure through the permeable layer.

9. A method for forming a hidden cavity and a device structure therein, the method comprising:
etching a trench into a semiconductor substrate;
depositing a sacrificial material in the trench and outside of the trench over the semiconductor substrate;
removing portions of the sacrificial material outside of the trench to form a lower portion of a sacrificial structure in the trench and on the semiconductor substrate;
after removing the portions of the sacrificial material to form the lower portion of the sacrificial structure, forming the device structure over the semiconductor substrate and the lower portion of the sacrificial structure;
after forming the device structure, forming an upper portion of the sacrificial structure over the device structure and lower portion of the sacrificial structure;
after forming the upper portion of the sacrificial structure, covering the sacrificial structure with a permeable layer; and
etching the sacrificial structure through the permeable layer to form the hidden cavity encapsulated by the semiconductor substrate, the device structure, and the permeable layer.

10. The method of claim 9 further comprising depositing a capping material over the permeable layer to form a capping layer, wherein the permeable layer is impermeable to the capping material and separates the capping layer from the hidden cavity.

11. The method of claim 9 wherein:
forming the upper portion of the sacrificial structure comprises:
depositing a sacrificial material on the semiconductor substrate, wherein the sacrificial material has a top surface; and
etching the sacrificial material to define the sacrificial structure with side surfaces; and
covering the sacrificial structure with the permeable layer comprises depositing a permeable material onto the top surface and side surfaces.

12. The method of claim 11 wherein etching the sacrificial structure through the permeable layer to form the hidden cavity comprises permeating an etchant through the permeable layer and into contact with the top surface and side surfaces.

13. The method of claim 9 depositing the sacrificial material in the trench and outside of the trench over the semiconductor substrate comprises filling the trench with a sacrificial material.

14. The method of claim 13 further comprising depositing a capping layer over the permeable layer, wherein the capping layer has a continuous planar bottom surface extending over the semiconductor substrate and the hidden cavity.

15. The method of claim 1 wherein forming the sacrificial structure in and/or over a substrate comprises:
depositing a sacrificial material in and/or over the substrate; and
etching the sacrificial material to form the sacrificial structure in and/or over the substrate.

16. The method of claim 1 wherein forming the sacrificial structure in and/or over a substrate comprises:
etching the substrate to form a trench, wherein the trench is bounded by a trench bottom surface formed by the substrate and trench side surfaces formed by the substrate;
depositing a sacrificial material in and/or over the substrate, wherein the sacrificial material fills the trench; and
removing the sacrificial material outside the trench to form a lower portion of the sacrificial structure in the trench;
wherein etching the sacrificial structure through the permeable layer forms the cavity completely bounded by the trench bottom surface, the trench side surfaces, the device structure, and the permeable layer.

17. The method of claim 1 wherein forming the sacrificial structure in and/or over the substrate comprises forming at least a portion of the sacrificial structure in a trench formed in the substrate, wherein the trench is bounded by a trench bottom surface formed by the substrate and trench side surfaces formed by the substrate; and wherein etching the sacrificial structure through the permeable layer forms the cavity completely bounded by the trench bottom surface, the trench side surfaces, the device structure, and the permeable layer.

18. A method for fabricating a semiconductor device with a cavity, the method comprising:
providing a substrate terminating at an uppermost surface;
forming a sacrificial structure in and/or over the substrate, wherein the sacrificial structure has side surfaces in contact with the substrate;
forming a device structure overlying a lower portion of the sacrificial structure, overlying the uppermost surface of the substrate, and underlying an upper portion of the sacrificial structure;
depositing a permeable layer over the sacrificial structure, the device structure and the substrate; and
etching the sacrificial structure through the permeable layer to form the cavity, wherein the cavity has an outer surface completely bounded by the substrate, the device structure, and the permeable layer.

19. The method of claim 18 wherein:
forming the sacrificial structure in and/or over the substrate comprises forming the sacrificial structure with a top surface; and
depositing the permeable layer over the sacrificial structure and the substrate comprises depositing the permeable layer on the top surface.

20. The method of claim 18 wherein:
forming the sacrificial structure in and/or over the substrate comprises forming the sacrificial structure with a bottom surface in contact with the substrate and with a top surface; and
depositing the permeable layer over the sacrificial structure and the substrate comprises depositing the permeable layer on the top surface.

* * * * *